(12) United States Patent  (10) Patent No.: US 7,180,766 B2
Morita  (45) Date of Patent: Feb. 20, 2007

(54) SEMICONDUCTOR MEMORY

(75) Inventor: Keizo Morita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 91 days.

(21) Appl. No.: 11/154,797

(22) Filed: Jun. 17, 2005

(65) Prior Publication Data
US 2006/0146625 A1 Jul. 6, 2006

(30) Foreign Application Priority Data
Jan. 5, 2005 (JP) ............................. 2005-000555

(51) Int. Cl.
G11C 11/22 (2006.01)
(52) U.S. Cl. ..................... 365/145; 365/185.2; 365/210
(58) Field of Classification Search ................ 365/145, 365/210, 185.2
See application file for complete search history.

(56) References Cited
U.S. PATENT DOCUMENTS
6,990,005 B2 * 1/2006 Saito .......................... 365/145
2004/0090814 A1 * 5/2004 Takahashi ................... 365/145

FOREIGN PATENT DOCUMENTS
EP 1 304 701 A1 4/2003
EP 1 600 979 A1 11/2005
JP 2001-118380 A 4/2001
JP 2002-100183 A 4/2002

* cited by examiner

Primary Examiner—Richard T. Elms
Assistant Examiner—Pho M. Luu
(74) Attorney, Agent, or Firm—Arent Fox PLLC

(57) ABSTRACT

The semiconductor memory has word lines; normal memory cells each having a storage capacitor; normal bit lines connected to the normal memory cells; a reference memory cell having a capacitor storing prescribed data; and a reference bit line connected to the reference memory cell. When a word line is selected, the potential of normal bit lines and of reference bit line changes according to the charge on the storage capacitors and on the reference capacitor. A current mirror circuit is also provided, which has a first transistor drain of which is connected to the reference bit line and second transistors drains of which are respectively connected to normal bit lines, the gates of the first and second transistors being connected in common to the reference bit line. Thus even though the capacitance values of ferroelectric capacitors is scattered, the scattering in bit line potentials during read operations can be prevented.

9 Claims, 4 Drawing Sheets

FIG. 1  SEMICONDUCTOR MEMORY USING FERROELECTRIC CAPACITOR

READ OPERATION OF FIG.1

WAVEFORM DIAGRAM OF EMBODIMENT

SEMICONDUCTOR MEMORY

CROSS-REFERENCE TO RELATED APPLICATIONS

This application is based upon and claims the benefit of priority from the prior Japanese Patent Application No. 2005-555, filed in Jan. 5, 2005, the entire contents of which are incorporated herein by reference.

BACKGROUND OF THE INVENTION

1. Field of the Invention

This invention relates to a semiconductor memory, and in particular relates to a read circuit for nonvolatile memory using a ferroelectric memory device.

2. Description of the Related Art

Ferroelectric memory (FeRAM) is a memory which uses ferroelectric capacitors as memory cells, and is a nonvolatile memory which can retain stored information even when the power supply is turned off. Similarly to SRAM and other memory types, ferroelectric memory can write and read data rapidly and with low power consumption. For these reasons, ferroelectric memory is used widely in IC cards, game equipment, tag chips, and other storage media. Such ferroelectric memory is for example described in Japanese Patent Laid-open No. 2002-100183 and Japanese Patent Laid-open No. 2001-118380.

Ferroelectric memory stores data using the polarization action of ferroelectric capacitors. For example, during writing a positive voltage is applied to a ferroelectric capacitor to cause polarization in the positive direction and write a data "0", or a negative voltage is applied to cause polarization in the negative direction and write a data "1". During reading, a positive voltage is applied to a ferroelectric capacitor, and a capacitor in the data "0" state does not have the polarization direction inverted, whereas a capacitor in the data "1" state undergoes inversion of the polarization direction; according to the magnitude of the amount of charge in the current flowing in the bit line as a result (a small amount of charge for data "0", a large amount of charge for data "1"), the potential of the bit line is set to a high level or to a low level (a high level for data "1", a low level for data "0").

Ferroelectric memory may be of the two-transistor, two-capacitor type, in which a memory cell consists of two transistors and two ferroelectric capacitors, or of the one-transistor, one-capacitor type, in which a memory cell consists of one transistor and one ferroelectric capacitor. In a two-transistor, two-capacitor memory cell, complementary data is recorded in the two capacitors, and during reading complementary signals are output to a bit line pair, and the complementary signals are detected by a sense amplifier. In a one-transistor, one-capacitor type memory cell, data is recorded in one capacitor, and during reading either a high level or a low level is output to a bit line, and a sense amplifier compares the bit line level with a reference level generated by a reference memory cell to detect the recorded data. In one-transistor, one-capacitor type memory, the circuit configuration of the memory cell is simple, but in a read operation it is necessary to perform comparison with the reference level of a reference memory cell, and there is a tendency for the detection margin to be small compared with the case of two-transistor, two-capacitor type memory.

SUMMARY OF THE INVENTION

The potential of a bit line is changed by the charge of the ferroelectric capacitor, and so the level is determined by the ratio of the bit line capacitance and the capacitance of the ferroelectric capacitor. Hence it is necessary that the capacitance value of ferroelectric capacitors be made uniform. Particularly in the case of one-transistor, one-capacitor type memory, no complementary signal is output to a bit line, and so there is a strong demand for a constant capacitance value for the ferroelectric capacitors of memory cells. However, the capacitance values of ferroelectric capacitors formed from ferroelectric material is scattered considerably due to the manufacturing process used therefor, and consequently there is also scattering in the bit line potential during reading, causing erroneous operation of the sense amplifier.

Hence an object of this invention is to provide a ferroelectric memory capable of suppressing erroneous read operations.

A further object of the invention is to provide a one-transistor, one-capacitor type ferroelectric memory capable of suppressing erroneous read operations.

In order to attain the above objects, the semiconductor memory of a first aspect of the invention has a plurality of word lines; a plurality of normal memory cells each having a storage capacitor; a plurality of normal bit lines connected to the normal memory cells; a reference memory cell having a capacitor storing prescribed data; and a reference bit line connected to the reference memory cell. When a word line is selected, the potential of the normal bit lines and of the reference bit line changes according to the charge on the storage capacitors and on the reference capacitor. A current mirror circuit is also provided, which has a first transistor the drain of which is connected to the reference bit line and a plurality of second transistors the drains of which are respectively connected to the plurality of normal bit lines, the gates of the first and second transistors being connected in common to the reference bit line.

When a normal memory cell is selected, different charges flow in the normal bit line according to the state of the storage capacitor of the normal memory cell, changing the potential of the bit line to a different level. In the storage capacitor of the reference memory cell is stored data causing a large amount of charge to flow to the reference bit line; when a normal memory cell is selected, the reference memory cell is also selected, and the potential of the reference bit line is made higher. Due to the current mirror circuit, the potential of the reference bit line is held at a level higher by the threshold voltage thereof than the source potential of the first transistor, the potential of a normal bit line of a normal memory cell storing the same data as the reference memory cell is held at the same level as the reference bit line, and the potential of a normal bit line of a normal memory cell storing data different from that of the reference memory cell is held at the source potential of the second transistor. Hence the potential of a normal bit line is reliably held at either a first level equal to the source potential, or at a second level higher than the source potential by the threshold voltage thereof. Thus even though the capacitance values of ferroelectric capacitors is scattered, the scattering in the bit line potentials during read operations can be prevented.

In the above first aspect, it is preferable that a preamp circuit, which amplifies the potential of a normal bit line based on the potential of the normal bit line and the potential of the reference bit line, is provided for each normal bit line. This preamp circuit compares a first level generated by the normal bit line, and a second level potential higher than the first level by a threshold voltage with the potential of the reference bit line, and performs amplification to the higher potential difference. If the source potentials of the first transistor and of the second transistor are the same, the potential of the reference bit line is always held at the second level, so that the amplification operation of the preamp circuit is performed more reliably.

In the above first aspect, it is preferable that each normal bit line is provided with a preamp circuit having an amplification transistor the drain of which is pre-charged, the source of which is connected to the normal bit line, and the gate of which is connected to the reference bit line. By means of this preamp circuit, when the normal bit line is at the first level the amplification transistor is conducting and the drain potential is greatly lowered from the pre-charge level, and when the normal bit line is at the second level the amplification transistor is not conducting and the drain potential is held at or slightly below the pre-charge level. By this means, the first and second levels of the normal bit line are converted into a low level lower than the source potential plus threshold voltage and a high level exceeding the source potential plus threshold voltage. Consequently the drain potential of the preamp circuit can easily be detected by the sense amplifier circuit provided in the next stage and amplified to the power supply level.

In the above first aspect, it is preferable that a normal memory cell have one cell transistor connected to the word line and a ferroelectric capacitor connected to the cell transistor. The ferroelectric capacitor stores data in a state of polarization in the positive direction and in a state of polarization in the negative direction. The reference memory cell has one cell transistor connected to the word line and a ferroelectric capacitor connected to the cell transistor. And, a state of polarization in the negative direction is stored in the ferroelectric capacitor of the reference memory cell. During reading, a voltage is applied in the positive direction to the ferroelectric capacitor, and charge flows in the bit line according to the polarization state. A greater amount of charge flows in the bit line from a capacitor in the state of polarization in the negative direction than from a capacitor in the state of polarization in the positive direction, causing the potential of the bit line to be made higher.

By means of these aspects of the invention, the potential of a bit line upon readout can be held reliably at the difference in threshold voltages of the second transistor by means of a current mirror circuit. Hence erroneous operation during readout can be suppressed.

DESCRIPTION OF THE PREFERRED EMBODIMENTS

Figure 1:
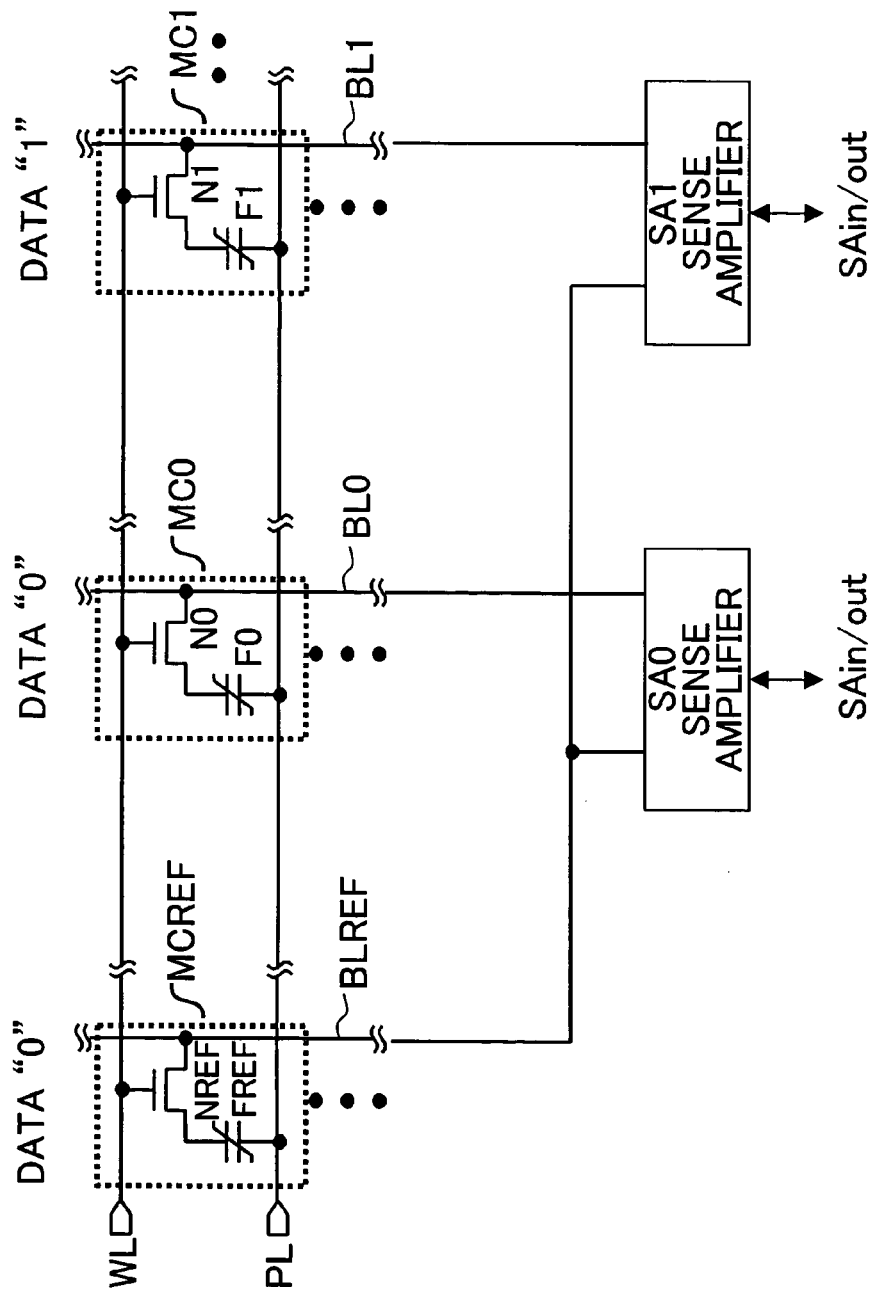
FIG. 1 shows the configuration of semiconductor memory using ferroelectric capacitors.

Below, embodiments of the invention are explained referring to the drawings. However, the technical scope of the invention is not limited to these embodiments, but extends to the inventions described in the scope of claims and to inventions equivalent thereto.

Prior to explaining the embodiments, semiconductor memory using ferroelectric capacitors is explained. The following example is for ferroelectric memory with one-transistor, one-capacitor type memory cells.

FIG. 1 shows the configuration of semiconductor memory using ferroelectric capacitors. In FIG. 1 are shown one word line WL, one plate line PL, two normal bit lines BL0 and BL1, one reference bit line BLREF, two normal memory cells MC0 and MC1, and one reference memory cell MCREF. Each of the memory cells MC0, MC1, MCREF has a cell transistor N0, N1, NREF the gate of which is connected to the word line and the terminal of the source or drain of which is connected to a bit line BL0, BL1, BLREF, and a ferroelectric capacitor F0, F1, FREF provided between the other terminal of the source or drain of the cell transistor and the plate line PL. That is, the memory cells are of the one-transistor, one-capacitor type.

Further, the normal bit lines BL0, BL1 are connected to the sense amplifiers SA0, SA1 respectively, and the sense amplifiers SA0, SA1 compare the potential of the normal bit line and the potential of the reference bit line BLREF, and detect and amplify the potential of the normal bit line.

In ferroelectric memory, writing is performed by applying a positive or negative voltage to the ferroelectric capacitor to cause polarization in the positive or negative direction, whereas in reading, the presence or absence of a polarization inversion current when a positive voltage is applied to the ferroelectric capacitor is detected. Also, since the ferroelectric capacitor is forcibly polarized in the positive direction during reading, re-writing must be performed corresponding to the data read.

Details are explained referring to FIG. 1. Word lines WL are connected to respective word driver circuits, not shown, and plate lines PL are connected in common to a plate driver circuit, not shown. Further, a write circuit, not shown, is provided in parallel with the sense amplifiers, and the normal bit lines BL0, BL1 are driven to H level or to L level according to the input data.

In the writing process, the word line WL is driven to H level, and the cell transistors N0, N1, NREF connected thereto are made conducting. By then applying a positive voltage or a negative voltage across the normal bit lines and the plate line, a positive voltage or negative voltage is applied to the ferroelectric capacitors F0 and F1, inducing a polarized state in the positive direction or negative direction, to write the input data. When writing data "0" to a normal memory cell, the bit line BL is set to 0 V and the plate line PL is set to the power supply level (VDD level) (positive voltage); when writing data "1", the bit line BL is set to the VDD level and the plate line PL is set to 0 V (negative voltage). Specifically, with the bit line BL put into the state corresponding to the input data, the plate line PL is changed between 0 V and VDD level, to cause polarization in the ferroelectric capacitor of the memory cell in the positive direction or in the negative direction, respectively. This polarization direction is retained after the write operation, and the memory is nonvolatile memory which retains the data even when the power supply is turned off.

Figure 2:
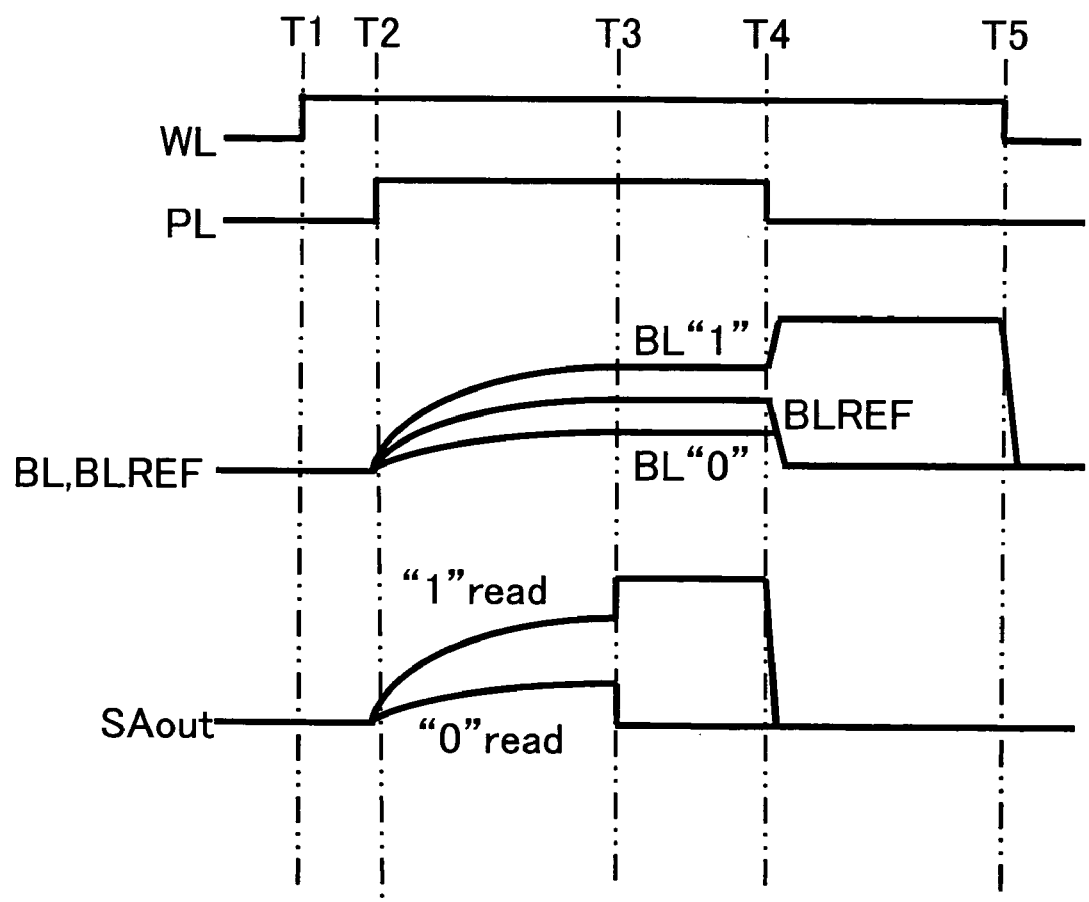
FIG. 2 is a waveform diagram of a read operation for the semiconductor memory of FIG. 1.

FIG. 2 is a waveform diagram of a read operation for the semiconductor memory of FIG. 1. In a read operation, with the potential of the bit lines BL, BLREF set to ground level (0 V), the word line WL is driven to H level to make the cell transistor conducting (time T1 in FIG. 2), after which the plate line PL is driven to H level (time T2). By this means a positive voltage is applied to the ferroelectric capacitors F0, F1, FREF. Through this application of voltage, the ferroelectric capacitor F0 of the normal memory cell MC0, which had been polarized in the positive direction (storing data "0"), has been applied a positive voltage with the same polarity as during writing, so that no polarization inversion occurs, only a slight amount of charge flows in the bit line BL0, and the potential of the bit line BL0 rises only slightly. On the other hand, in the case of the ferroelectric capacitor F1 of the normal memory cell MC1 which had been polarized in the negative direction (storing data "1"), a positive voltage, of polarity opposite that at the time of writing, is applied, so that polarization inversion occurs, a large amount of inversion charge flows in bit line BL1, and there is a large rise in the potential of bit line BL1.

On the other hand, data "0" is written to the reference ferroelectric capacitor FREF of the reference memory cell MCREF; but the reference ferroelectric capacitor is formed to have a larger area than the ferroelectric capacitor of a normal memory cell. Hence upon driving the word line WL to H level, a positive voltage is applied to the reference ferroelectric capacitor FREF and no polarization inversion occurs, but because the area is large, the potential of the reference bit line BLREF rises higher than the potential of a normal bit line for data "0", but rises less than the increase in normal bit line potential for data "1". That is, the reference bit line BLREF rises to an intermediate potential. When the sense amplifiers SA0, SA1 are activated (at time T3), the potentials of the normal bit lines BL0 and BL1 are detected with reference to the potential of the reference bit line BLREF and are amplified to ground potential (0 V) and to the power supply level (VDD level) respectively.

With this, the read operation ends; but in this state, all ferroelectric capacitors are in a forward-direction polarization state due to the positive voltage for reading, and so to restore the previous destroyed state, re-writing is performed. That is, while the plate line PL is at H level, a positive voltage is applied to the ferroelectric capacitors of memory cells the bit line of which is at L level, that is, to which data "0" had been written, so that the capacitor is caused to be the same state as at the time of writing. Then, by means of a write circuit, not shown, the voltage detected by the sense amplifier is applied to the bit line while the plate line PL is lowered to L level (at time T4), so that in the case of memory cells to which data "1" had been written, because the bit line is at H level, a negative voltage is applied to the ferroelectric capacitor to perform re-writing. At this time the polarization of a ferroelectric capacitor of a data "0" memory cell is not inverted, since the bit line is at L level and the plate line is at L level, and so the forward-direction polarization state is maintained. When the re-write operation ends, the word line WL is returned to L level (at time T5). The reference bit line BLREF is driven to ground level by a re-write circuit, not shown, and data "0" is written to the reference memory cell.

Thus in a read operation, either a large or a small rise in potential of the normal bit lines BL0 and BL1 is caused according to whether inversion of the polarization of the ferroelectric capacitor does or does not occur, while on the other hand the reference bit line BLREF is raised to an intermediate potential, and the differences in these potentials are detected by sense amplifiers. Hence when there is scattering in the capacitance values of ferroelectric capacitors, there is also scattering in the extent of the potential rise occurring on bit lines, so that erroneous operation of sense amplifiers occurs. However, the ferroelectric layer of ferroelectric capacitors tends to be affected by process scattering, and it is difficult to suppress such scattering in capacitance values.

Figure 3:
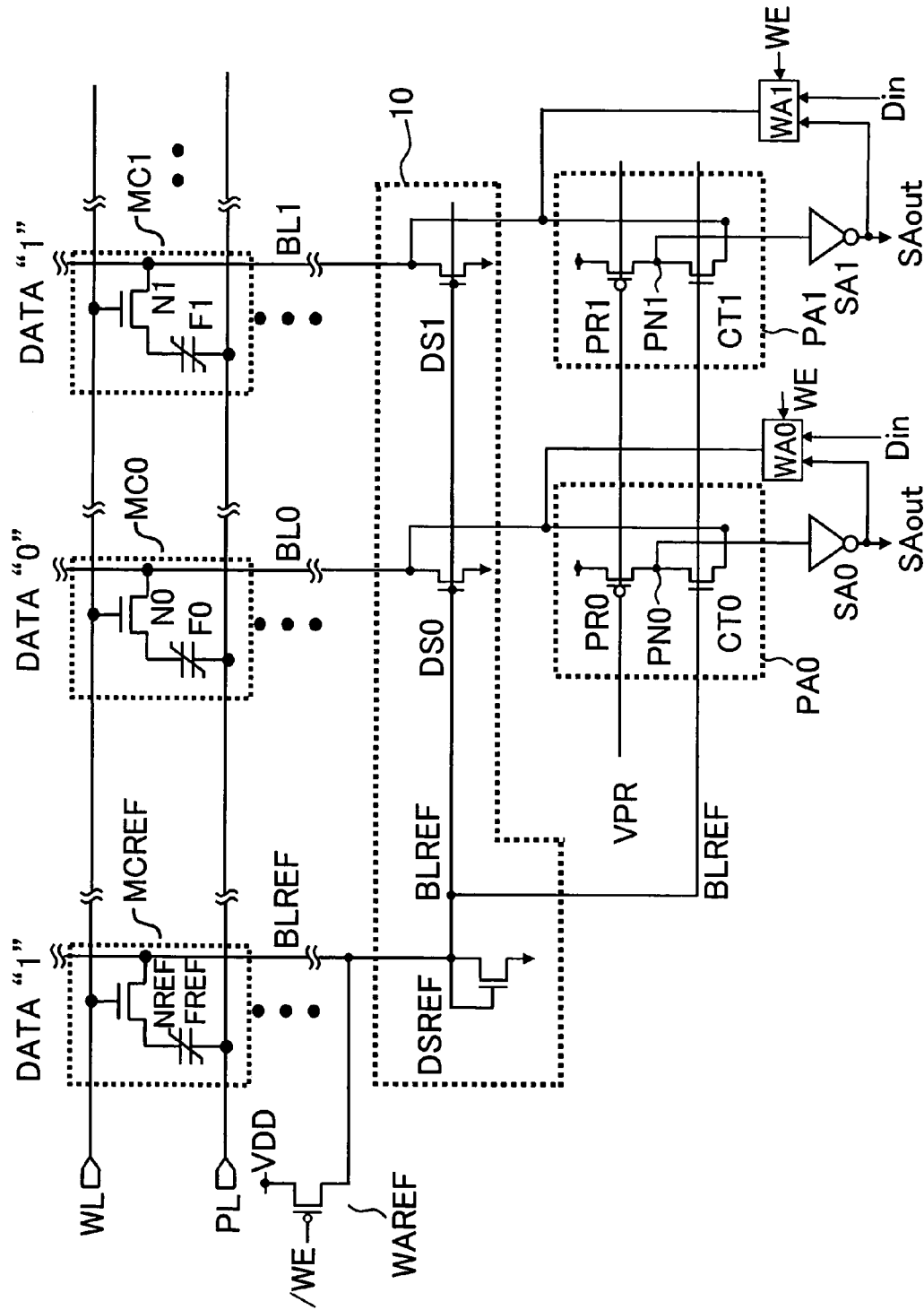
FIG. 3 shows the configuration of semiconductor memory in a present embodiment; and, FIG. 4 is a waveform diagram of a read operation for the present embodiment.

FIG. 3 shows the configuration of the semiconductor memory in this embodiment. The configuration of the normal memory cells MC0 and MC1, the word line WL, plate line PL, and normal bit lines BL0 and BL1 is the same as in FIG. 1. The reference memory cell MCREF has a cell transistor NREF and a reference ferroelectric capacitor FREF, and the capacitor FREF has the same area and the same structure as the ferroelectric capacitors F0 and F1 of the normal memory cells. A negative-direction polarization state (data "1") is always written to the reference memory cell MCREF through application of a negative voltage. Hence during reading, an increase to a high potential occurs in the reference bit line BLREF, similarly to the bit line of a memory cell storing data "1".

In the memory of this embodiment, in order to render read operations more stable, a current mirror circuit 10 is provided. That is, the current mirror circuit 10 has a first transistor DSREF, the gate and drain of which are connected to the reference bit line BLREF, and a plurality of second transistors DS0, DS1 the drains of which are connected to the normal bit lines BL0, BL1, and the gates of which are connected to the reference bit line BLREF; the sources of these transistors are connected to a common power supply, such as for example a ground power supply. The first transistor DSREF and the second transistors DS0, DS1 are all connected to the same gate potential, so that the drain currents are proportional to the transistor size. That is, if the transistor size is the same, the drain currents are all equal.

Suppose that the normal memory cell MC0 stores data "0" (positive-direction polarization), and that MC1 stores data "1" (negative-direction polarization). As explained above, data "1" (negative-direction polarization) is stored in the reference memory cell MCREF. In a read operation, when the word line WL is driven to H level, the cell transistors in the memory cells connected to the word line WL are made conducting. When the plate line PL is then driven to H level, the amount of charge flowing out to the bit line BL0 from the memory cell MC0 storing data "0" (positive-direction polarization) is small, and there is little increase in the potential of the bit line BL0. However, the amount of charge flowing into the bit lines BL1 and BLREF from the memory cells MC1 and MCREF, which store data "1" (negative-direction polarization), is large, so that there is a large increase in the potential of the bit lines BL1 and BLREF.

At this time, in the current mirror circuit 10 the first transistor DSREF connected to the reference bit line BLREF is conducting, and causes the potential of the reference bit line BLREF to fall; this potential is higher than the ground potential, which is the source potential, by the amount of the threshold voltage of the first transistor DSREF. The reference bit line BLREF is also connected to the gates of the second transistors DS0 and DS1, so that due to conduction by the second transistor DS0 the potential of the normal bit line BL0 falls substantially to ground level, and due to conduction by the second transistor DS1 the potential of the normal bit line BL1 is at a level higher than ground potential, which is the source potential, by the amount of the threshold voltage of the second transistor DS1. That is, because the gate potentials of the transistor DSREF and of the transistor DS1 are the same, if the sizes of the transistors are the same, then the same amount of drain current flows. Hence the same behavior occurs in the normal bit line BL1 of a normal memory cell storing data "1" and in the reference bit line BLREF, and both are held at the same potential, higher than ground potential by the amount of the threshold voltage. This action is due to the current mirror circuit.

As a result, even when there is some scattering in the capacitance values of the ferroelectric capacitors of normal memory cells, the normal bit line potential of memory cells in which data "1" is stored is held at the same level as the reference bit line potential, and the normal bit line potential of memory cells in which data "0" is stored is held at the source power supply potential, i.e. ground level. Hence read operations can be made stable.

In the embodiment shown in FIG. 3, the potential of normal bit lines held at a prescribed potential by the current mirror circuit 10 is amplified by the preamp circuits PA0 and PA1. That is, through control by the current mirror circuit 10, the potential of normal bit lines is held at either ground level or the threshold voltage level. In order to detect such a potential difference, use of a reference potential equal to one-half the threshold voltage is conceivable, but generating such a reference potential is not easy. Hence the preamp circuits PA0 and PA1 amplify the ground level and threshold voltage level of the normal bit line potentials, shifting the levels to a level lower than and higher than the threshold voltage level.

Specifically, the preamp circuits PA0, PA1 comprise p-channel precharge transistors PR0, PR1 the sources of which are connected to the power supply and to the gates of which is applied a precharge signal VPR, and amplification transistors CT0, CT1 the gates of which are connected to the reference bit line BLREF and the sources of which are respectively connected to the normal bit lines BL0, BL1. When the precharge signal VPR goes to L level, the precharge transistors PR0, PR1 are conducting, and the precharge nodes PN0, PN1 are precharged to the power supply level.

When in this state the word line WL is driven to H level and the read operation starts, the reference bit line BLREF is held at threshold voltage level, the normal bit line BL0 is held at ground level, and the normal bit line BL1 is held at threshold voltage level (the same level as the reference bit line) by the above-described current mirror circuit 10. Then, the amplification transistor CT0 of the preamp PA0 is conducting, and the precharge node PN0 is lowered to ground level. On the other hand, the amplification transistor CT1 of the preamp PA1 is non-conducting, and the potential at the precharge node PN1 is lowered only somewhat. That is, the preamp amplification transistor compares the reference bit line potential and the normal bit line potential, and according to the comparison result executes control to either lower or not lower the precharge node level.

The potentials at the precharge nodes PN0 and PN1 of the preamps PA0, PA1 are input to the sense amps SA0, SA1, comprising inverter circuits, and are amplified to the power supply level or ground level. These sense amp circuits may be ordinary CMOS inverter circuits not synchronized by a clock, or may be CMOS inverter circuits activated in synchronization with a clock signal. A preamp amplifies the potential of a normal bit line to a level either higher than or lower than the threshold voltage of the sense amp, and so the sense amp can easily detect the pre-amplified level.

In the embodiment of FIG. 3, write circuits WA0, WA1 are provided, and the outputs SAout of the sense amps SA0, SA1 are fed back to the normal bit lines BL0, BL1 via the write circuits to perform re-writing. A write circuit switches to the re-write circuit at read time or to the write circuit at write time according to the write signal WE. When the write circuits WA0, WA1 are switched to re-write circuits, the sense amp output SAout is inverted and transferred to the corresponding normal bit line. The plate line PL is then driven from H level to L level, so that re-writing of the ferroelectric capacitors of the normal memory cells is performed according to the feedback level on the normal bit lines BL0, BL1.

Figure 4:
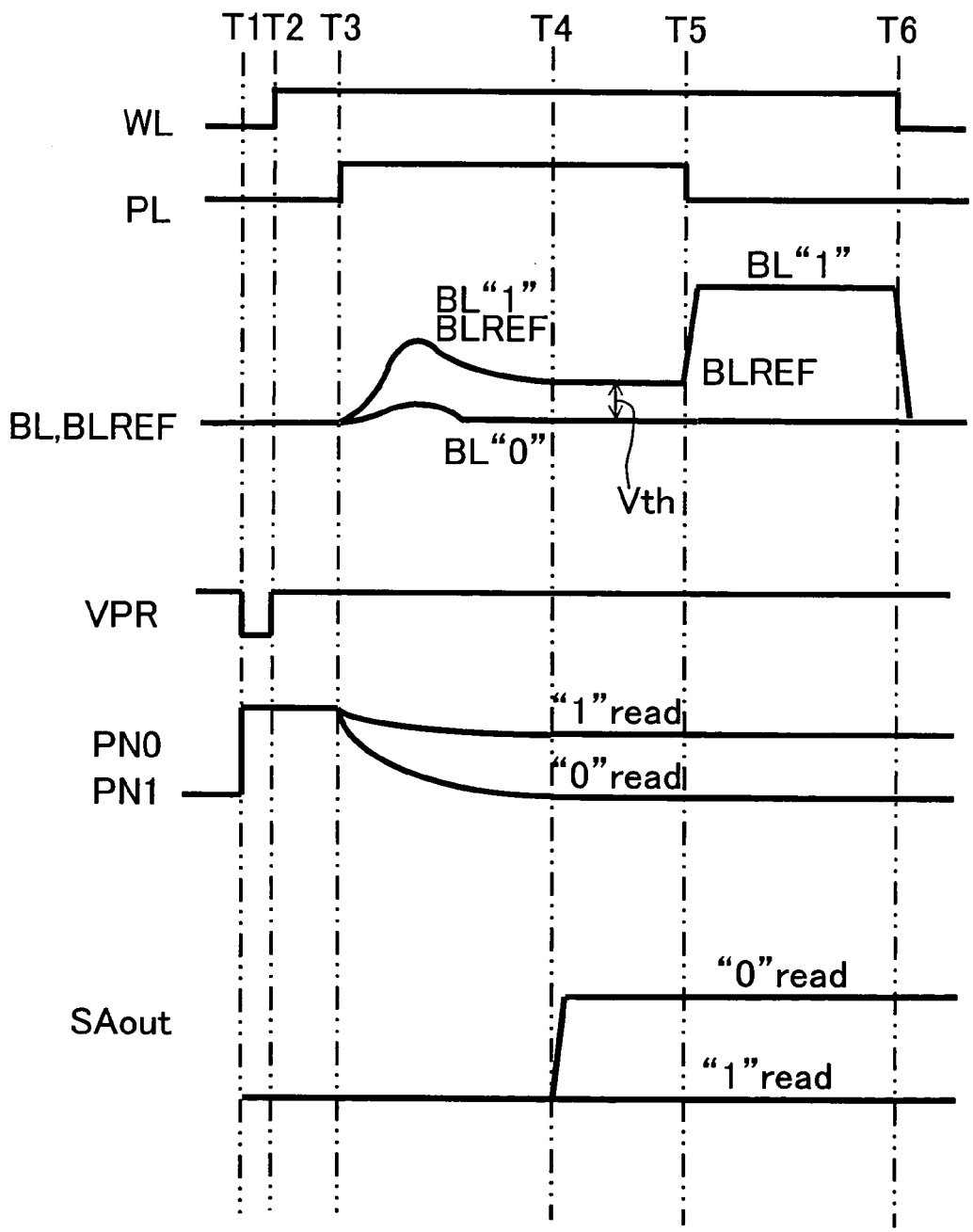

FIG. 4 is a waveform diagram of a read operation for this embodiment. Operation is again explained referring to the waveform diagram. First, at time T1 a precharge signal VPR at L level causes the precharge transistors PR0, PR1 to both be conducting, and the precharge nodes PN0, PN1 are precharged to the power supply level. From this state, at time T2 the word line WL is driven to H level, and the cell transistors N0, N1, NREF of each of the memory cells are made conducting. Then, upon driving the plate line PL from L level to H level, a positive-direction voltage is applied to the ferroelectric capacitors F0, F1, FREF of all the memory cells. No polarization inversion occurs in the capacitor F0 of the memory cell MC0 storing data "0", so there is only a slight rise in the potential of the bit line BL0. On the other hand, polarization inversion occurs in both the capacitors F1 and FREF of the memory cells MC1 and MCREF storing data "1", a large amount of inversion charge flows in the bit lines, and there is a substantial increase in the voltage of the bit lines BL1 and BLREF. In the drawing, the rise in potential of the bit lines BL corresponding to the stored data "0" or "1" is shown.

Due to the rise in potential of the reference bit line BLREF at this time, the amplification transistors CT0, CT1 of the preamps PA0, PA1 are both made conducting, and the potential at both precharge nodes PN0, PN1 falls. However, the normal bit line BL1 behaves similarly to the reference bit line BLREF, so that the amplification transistor CT1 of the preamp PA1 becomes nonconducting, and the decline in potential at the precharge node PN1 stops. On the other hand, the potential at the precharge node PN0 of the preamp PA0 falls to ground level.

As explained above, the potentials of the normal bit lines BL0 and BL1 are held at ground level and at the threshold voltage level Vth. The precharge node PN0 falls to near ground level, and the precharge node PN1 is held at close to power supply level. When at time T4 the precharge node PN0 falls lower than the threshold level of the sense amp, the output SAout of the sense amp SA0 rises to the power supply level, and the output SAout of the sense amp SA1 is maintained at ground level.

In this state, a positive voltage is applied to the ferroelectric capacitor F0 of memory cell MC0, which had been storing data "0", so that re-writing is completed while the plate line PL is at H level. On the other hand, at time T5 the write circuits WA0, WA1 are controlled by the write circuits to drive the plate line PL to L level, and a negative voltage is applied to the ferroelectric capacitors F1, FREF of memory cells MC1 and MCREF which had been storing data "1", so that the polarization state is inverted and negative-direction polarization occurs to perform re-writing. When re-writing ends, at time T6 the word line WL is returned to L level, and the write operation is completed.

A re-write circuit WAREF is provided on the side of the reference memory cell MCREF, and at time T5 the p-channel transistor thereof conducts in response to a L-level re-write signal /WE, and the reference bit line BLREF is driven to power supply level VDD. Then the plate line PL is driven to L level, so that a negative voltage is applied to the ferroelectric capacitor FREF of the reference memory cell to cause polarization in the negative direction, thus performing re-writing. On the reference bit line side there is no need to detect the level, and so there is no need to provide a preamp and sense amp; it is sufficient to provide a circuit which drives the reference bit line BLREF to H level with the re-write timing.

In the above embodiments, the invention is applied to one-transistor, one-capacitor type ferroelectric memory. This type of memory has a simple memory cell circuit configuration, and so is appropriate for devices with large storage capacities. By using a current mirror circuit 10 in this embodiment, the potential of normal bit lines BL can always be driven to ground level or to the threshold voltage level Vth even when there is scattering in the capacitance values of ferroelectric capacitors, so that erroneous read operations can be suppressed.

Further, the current mirror circuit 10 in the above embodiment can also be applied to other types of semiconductor memory not using ferroelectric capacitors. However, in the case of capacitors using silicon oxide film and not using ferroelectric material, there is little scattering in capacitance values even for processes currently in use, so that the advantages of the current mirror circuit 10 in preventing erroneous operation are not so great as in the case of application to ferroelectric capacitors.

What is claimed is:

1. A semiconductor memory, comprising:
   a plurality of word lines;
   a plurality of normal memory cells each having a storage capacitor;
   a plurality of normal bit lines each connected to said respective normal memory cells;
   a reference memory cell having a reference capacitor to store prescribed data; and
   a reference bit line connected to said reference memory cell,
   wherein, when said word lines are selected, potential of said normal bit lines and said reference bit line changes according to charge on said storage capacitors and on said reference capacitor;
   the semiconductor memory further comprising
   a current mirror circuit, including a first transistor drain of which is connected to said reference bit line and a plurality of second transistors drains of which are respectively connected to said plurality of normal bit lines, and in which the gates of said first and second transistors are connected in common to said reference bit line; and
   a plurality of preamp circuits, provided for each of said normal bit lines, each of which amplifies the potential of said normal bit line based on the potential of said normal bit line and on the potential of said reference bit line.

2. The semiconductor memory according to claim 1, wherein said plurality of preamp circuits, provided for each normal bit line, each have an amplification transistor drain of which is precharged, source of which is connected to said normal bit line, and gate of which is connected to said reference bit line.

3. The semiconductor memory according to claim 1 or claim 2, further comprising a plurality of sense amplifiers to which output of said preamp circuits is input, and which amplify said input level, said sense amplifiers being provided for each of said normal bit lines.

4. The semiconductor memory according to claim 3, further comprising a plurality of re-write circuits, which apply output of said sense amplifiers to the corresponding normal bit line with a re-write timing, said re-write circuits being provided for each of said normal bit lines.

5. The semiconductor memory according to claim 1, wherein said normal memory cells each have one cell transistor connected to said word line and said storage capacity comprising a ferroelectric capacitor connected to the cell transistor, and said reference memory cell has one cell transistor connected to said word line and said reference capacitor comprising a ferroelectric capacitor connected to said cell transistor.

6. The semiconductor memory according to claim 5, wherein the ferroelectric capacitor of said reference memory cell has a structure equivalent to that of the ferroelectric capacitors of said normal memory cells, and performs writing using a voltage opposite the voltage state during reading.

7. A ferroelectric semiconductor memory, comprising:
   a plurality of word lines;
   a plurality of normal memory cells each having a cell transistor connected to said word line and a ferroelectric capacitor for storage connected to the cell transistor;
   a plurality of normal bit lines each connected to said respective normal memory cells;
   a reference memory cell having a cell transistor connected to said word line and a reference ferroelectric capacitor connected to the cell transistor and which stores an opposite polarization state;
   a reference bit line connected to said reference memory cell; and
   a plate line connected to terminals on the opposite side of said ferroelectric capacitors,
   wherein, when said word lines are selected, potential of said normal bit lines and said reference bit line changes according to polarization states of said storage capacitors and of said reference capacitor;
   the ferroelectric semiconductor memory further comprising
   a current mirror circuit, including a first transistor drain of which is connected to said reference bit line and a plurality of second transistors drains of which are respectively connected to said plurality of normal bit lines, and in which gates of said first and second transistors are connected in common to said reference bit line;
   a plurality of preamp circuits, having an amplification transistor drain of which is precharged, source of which is respectively connected to said normal bit lines, and gate of which is connected to said reference bit line; and,
   a plurality of sense amplifiers, to which outputs of said plurality of preamp circuits are respectively input, and which amplify said input levels.

8. The ferroelectric semiconductor memory according to claim 7, further comprising a plurality of re-write circuits, provided for each of said normal bit lines, which apply output of said sense amplifiers to the corresponding normal bit line with a re-write timing.

9. The ferroelectric semiconductor memory according to claim 7 or claim 8, wherein said normal memory cells each have one cell transistor connected to said word line and said storage capacitor comprising a ferroelectric capacitor connected to said cell transistor, and said reference memory cell has one cell transistor connected to said word line and said reference capacitor comprising a ferroelectric capacitor connected to said cell transistor.

* * * * *